(12) United States Patent
Sheperek et al.

(10) Patent No.: US 10,761,749 B2
(45) Date of Patent: Sep. 1, 2020

(54) VECTORIZED PROCESSING LEVEL CALIBRATION IN A MEMORY COMPONENT

(71) Applicant: Micron Technology, Inc., Boise, ID (US)

(72) Inventors: Michael Sheperek, Longmont, CO (US); Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/176,173

(22) Filed: Oct. 31, 2018

(65) Prior Publication Data
US 2020/0133528 A1    Apr. 30, 2020

(51) Int. Cl.
  *G06F 3/06*    (2006.01)
(52) U.S. Cl.
  CPC .......... *G06F 3/0629* (2013.01); *G06F 3/0619* (2013.01); *G06F 3/0655* (2013.01); *G06F 3/0679* (2013.01)
(58) Field of Classification Search
  CPC .... G06F 3/0629; G06F 3/0619; G06F 3/0635; G06F 3/0679
  See application file for complete search history.

(56) References Cited

U.S. PATENT DOCUMENTS

| 6,850,430 | B1 | 2/2005 | Perner | |
| 9,164,881 | B2 | 10/2015 | Seol et al. | |
| 9,576,671 | B2 | 2/2017 | Karakulak et al. | |
| 9,761,308 | B1* | 9/2017 | Cometti | G11C 29/52 |
| 10,210,926 | B1* | 2/2019 | Amiri | G11C 11/5642 |
| 2010/0296350 | A1 | 11/2010 | Kim et al. | |
| 2012/0254699 | A1* | 10/2012 | Ruby | G06F 11/1048 714/773 |
| 2014/0365836 | A1 | 12/2014 | Jeon et al. | |
| 2015/0117107 | A1* | 4/2015 | Sun | G11C 16/10 365/185.12 |
| 2016/0118129 | A1* | 4/2016 | Muchherla | G11C 16/26 365/185.12 |

(Continued)

FOREIGN PATENT DOCUMENTS

KR    20140050145 A    4/2014

OTHER PUBLICATIONS

International Application No. PCT/US2019/057831—International Search Report and Written Opinion, dated Feb. 13, 2020, 10 pages.

*Primary Examiner* — Hiep T Nguyen
(74) *Attorney, Agent, or Firm* — Perkins Coie LLP (57) ABSTRACT

First and second vectors each respectively having first and second magnitudes and first and second phase angles relative to a reference axis are determined by a processing device based on a set of error values corresponding a current processing level for processing data in memory operations on memory cells of a memory component. An estimated processing level offset is generated based on a comparison between at least one of a difference between the first magnitude and the second magnitude or a difference between the first phase angle and the second phase angle. An updated processing level is generated based on the estimated processing level offset, and the updated processing level replaces the current processing level.

20 Claims, 7 Drawing Sheets

(56) References Cited

U.S. PATENT DOCUMENTS

2016/0148702 A1\* 5/2016 Karakulak ............. G11C 16/26
                                                    365/185.12
2017/0235633 A1    8/2017 Park
2018/0341553 A1\* 11/2018 Koudele ................ G11C 29/52

\* cited by examiner

SAMPLE CENTER, FIRST, AND SECOND ERROR VALUES FOR A CURRENT PROCESSING LEVEL, A FIRST OFFSET PROCESSING LEVEL, AND A SECOND OFFSET PROCESSING LEVEL, RESPECTIVELY, WHEREIN THE FIRST OFFSET PROCESSING LEVEL IS DIFFERENT FROM THE SECOND OFFSET PROCESSING LEVEL
610

DETERMINE A FIRST VECTOR HAVING A FIRST MAGNITUDE AND A FIRST PHASE ANGLE RELATIVE TO A REFERENCE AXIS, THE FIRST VECTOR CORRESPONDING TO A DIFFERENCE BETWEEN THE CENTER AND FIRST ERROR VALUES
620

DETERMINE A SECOND VECTOR HAVING A SECOND MAGNITUDE AND A SECOND PHASE ANGLE RELATIVE TO THE REFERENCE AXIS, THE SECOND VECTOR CORRESPONDING TO A DIFFERENCE BETWEEN THE CENTER AND SECOND ERROR VALUES
630

GENERATING AN ESTIMATED PROCESSING LEVEL OFFSET BASED ON AT LEAST ONE OF A DIFFERENCE BETWEEN THE FIRST MAGNITUDE AND THE SECOND MAGNITUDE OR A DIFFERENCE BETWEEN THE FIRST PHASE ANGLE AND THE SECOND PHASE ANGLE
640

GENERATING AN UPDATED PROCESSING LEVEL BASED ON THE ESTIMATED PROCESSING LEVEL OFFSET, THE UPDATED PROCESSING LEVEL TO REPLACE THE CURRENT PROCESSING LEVEL, WHEREIN THE CURRENT PROCESSING LEVEL AND THE UPDATED PROCESSING LEVEL RELATE TO PROCESSING DATA CORRESPONDING TO A SUBSET OF A PLURALITY OF MEMORY CELLS OF A MEMORY COMPONENT
650

VECTORIZED PROCESSING LEVEL CALIBRATION IN A MEMORY COMPONENT

TECHNICAL FIELD

Embodiments of the disclosure generally relate to memory sub-systems, and more specifically, relate to vectorized processing level calibration in a memory component of a memory sub-system.

BACKGROUND

A memory sub-system can be a storage system, such as a solid-state drive, and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to providing vectorized processing level calibration in a memory sub-system. Processing level means the threshold voltage used for performing a memory operation (e.g., a read operation, a write operation, or an erase operation) on a memory cell. For example, for TLC-type memory, the processing level is the respective threshold voltage corresponding to level L0 to level L7 for a given type of memory operation. For example, in a read memory operation, the processing level corresponds to the target voltage level used for reading a memory cell. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system using write (also hereinafter referred to as "program") requests and can retrieve data from the memory sub-system using read requests. In some embodiments, the memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory.

Memory components, such as flash based memory, utilize electrical energy, along with corresponding threshold levels or processing voltage levels, to store and access data. During operation of the memory components, electrical characteristics of the memory components (i.e. charge retention capabilities) can change due to repeated data writes, erase, and/or reads. The changes in the electrical characteristics can cause the threshold voltage distributions (also hereinafter referred to as "program distributions") in the flash based memory to shift, which can affect the voltage levels used at the gates of the memory cells for memory operations, such as, for example, read operations and write operations. Write operations are also hereinafter referred to as "program verify (PV) operations." If the changes in the electrical characteristics are not properly compensated, the shift in the program distributions can cause performance and reliability issues by, for example, increasing the error count and/or the error rate of memory operations.

A conventional memory sub-system can have memory components with calibration circuits to provide voltage adjustments (also hereinafter referred to as "trims") for compensating the gate voltage levels at the memory cells during memory operations to account for a shift in the program distributions (and any associated performance/reliability issues). The calibration procedure can include applying the trims to the appropriate gate voltage level when performing read operations and PV operations to minimize errors associated with the memory operations. However, the calibration operations in such conventional memory sub-systems can be inadequate for a variety of reasons. For example, conventional calibration operations can require numerous iterations before a trim is adequate. In addition, conventional calibration operations may not take into account the program distribution valley characteristics and can be susceptible to noise with respect to sampling error readings. Accordingly, a conventional memory device can experience poor performance and reliability due to high error counts and/or high error rates during memory operations.

Aspects of the present disclosure address the above and other deficiencies by initiating processing level calibration that provides trims for the gate voltage levels applied to memory cells of a memory sub-system to minimize the error count (e.g., bit error rate) for the memory operation. In some embodiments, a memory sub-system can include a vectorized processing level calibration component to provide the trims to the gate voltage levels. For example, the processing level calibration component can compensate the read levels and/or PV levels at the memory cells to account for shifts in the program distributions.

Figure 1:
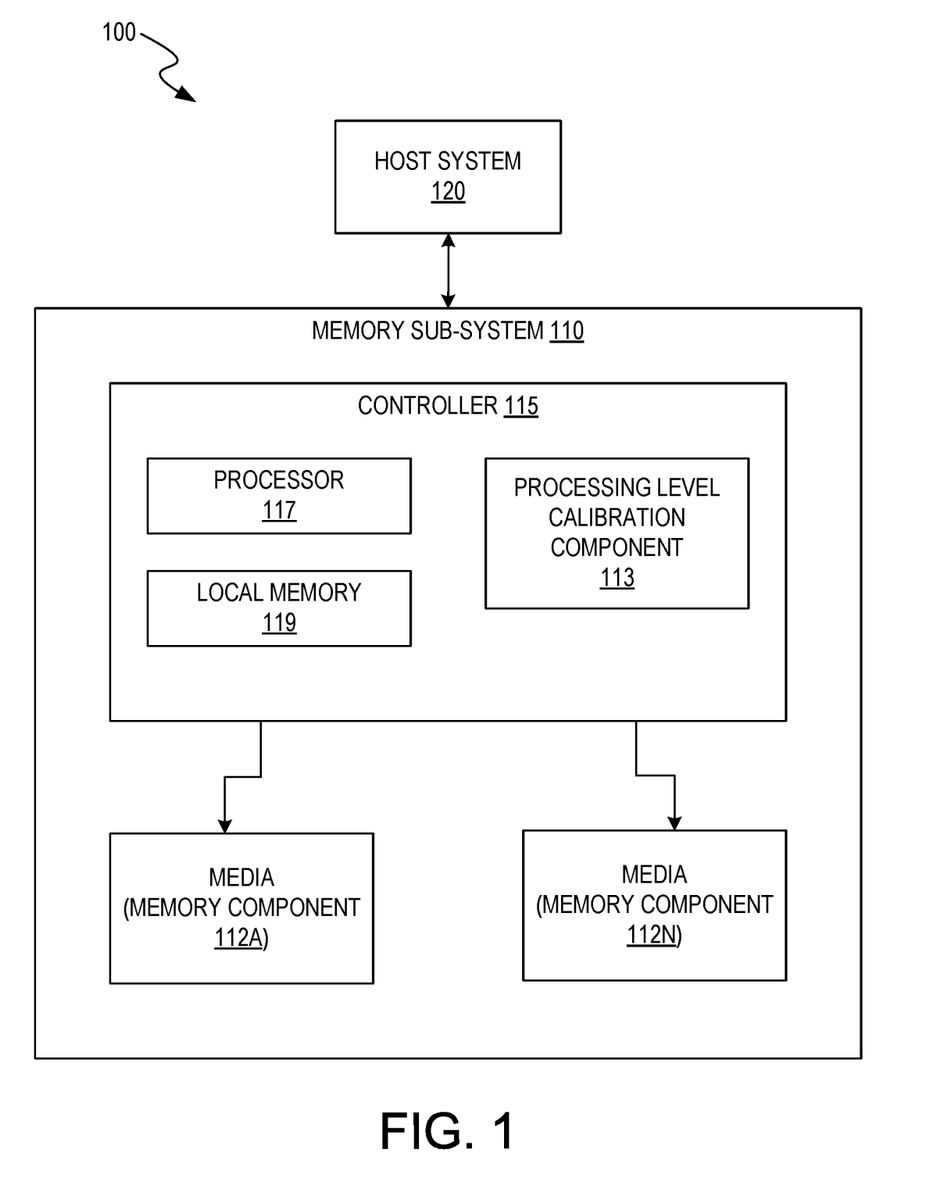
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fiber Channel, Serial Attached SCSI (SAS), etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory components 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs), multi-level cells (MLCs) (e.g., triple level cells (TLCs), or quad-level cells (QLCs)). In some embodiments, a particular memory component can include both an SLC memory portion and a MLC memory portion. Each of the memory cells can store one or more bits of data (e.g., data blocks) used by the host system 120. Although non-volatile memory devices such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The memory system controller 115 (hereinafter referred to as "controller") can communicate with the memory devices 112A to 112N to perform operations such as reading data, writing data, or erasing data at the memory devices 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N. Each of the memory components 112A to 112N can include one or more dies.

The memory sub-system 110 includes a processing level calibration component 113 that can be used to trim the gate level voltages during memory operations to account for shifts in program distributions. In some embodiments, the controller 115 includes at least a portion of the processing level calibration component 113. For example, the controller 115 can include a processor 117 (processing device) configured to execute instructions stored in local memory 119 for performing the operations described herein. In some embodiments, the processing level calibration component 113 is part of the host system 110, an application, or an operating system.

The processing level calibration component 113 can receive data related to memory operations on memory cells in memory components 112A to 112N and change processing levels (e.g., read levels and/or PV levels) based on the received data. The memory cells can correspond to, for example, a page type, a logical or stored value, a word line group, a word line, a memory component, or any combination thereof. In some embodiments, the processing level calibration component 113 can dynamically calculate or adjust the processing levels based on feedback information from memory operations. For example, processing level calibration component 113 can continuously update the threshold voltage of a read level corresponding to a read memory operation for a group of memory cells based on an error value. The error value can represent a degree, a frequency, an amount or magnitude, a size or number, a processing derivation of the errors, or a combination thereof describing the errors. For example, the error value can include an error count, an error rate, or a combination thereof. The error count can represent an amount or magnitude, a degree, a size or number, or a combination thereof describing the errors. For example, the error count can be a bit error count (BEC). The error rate can represent a frequency or a probability of occurrence of the errors, a proportional amount or a percentage of errors, or a combination thereof. For example, the error rate can include a bit error rate (BER). The error value can correspond to one or more units or groupings within the memory cells of the memory component. For example, the error value can be for one or more of memory pages, word-line groups, memory components, or any combination thereof corresponding to the memory cells. Also for example, the error value can correspond to the page type, such as for the lower page (LP), the upper page (UP), the extra page (XP), or the top page (TP). The error value can be calculated or tracked by the host device 120, the controller 115, or a combination thereof. The error value can be stored in the host device 120, local memory 119, one or more of memory components 112A to 112N, another memory location of the memory sub-system 110, or any combination thereof.

Details regarding the processing level calibration component 113 are discussed below with respect to read operations and the corresponding read levels. While the figures and description relate to an embodiment in which the processing level calibration component 113 uses a measured error count to calibrate a read level, the present technology may be used, in other embodiments, to similarly calibrate other processing levels (e.g., PV level, threshold level, etc.) in view of other measured characteristics (bit error rate, etc.).

Figure 2:
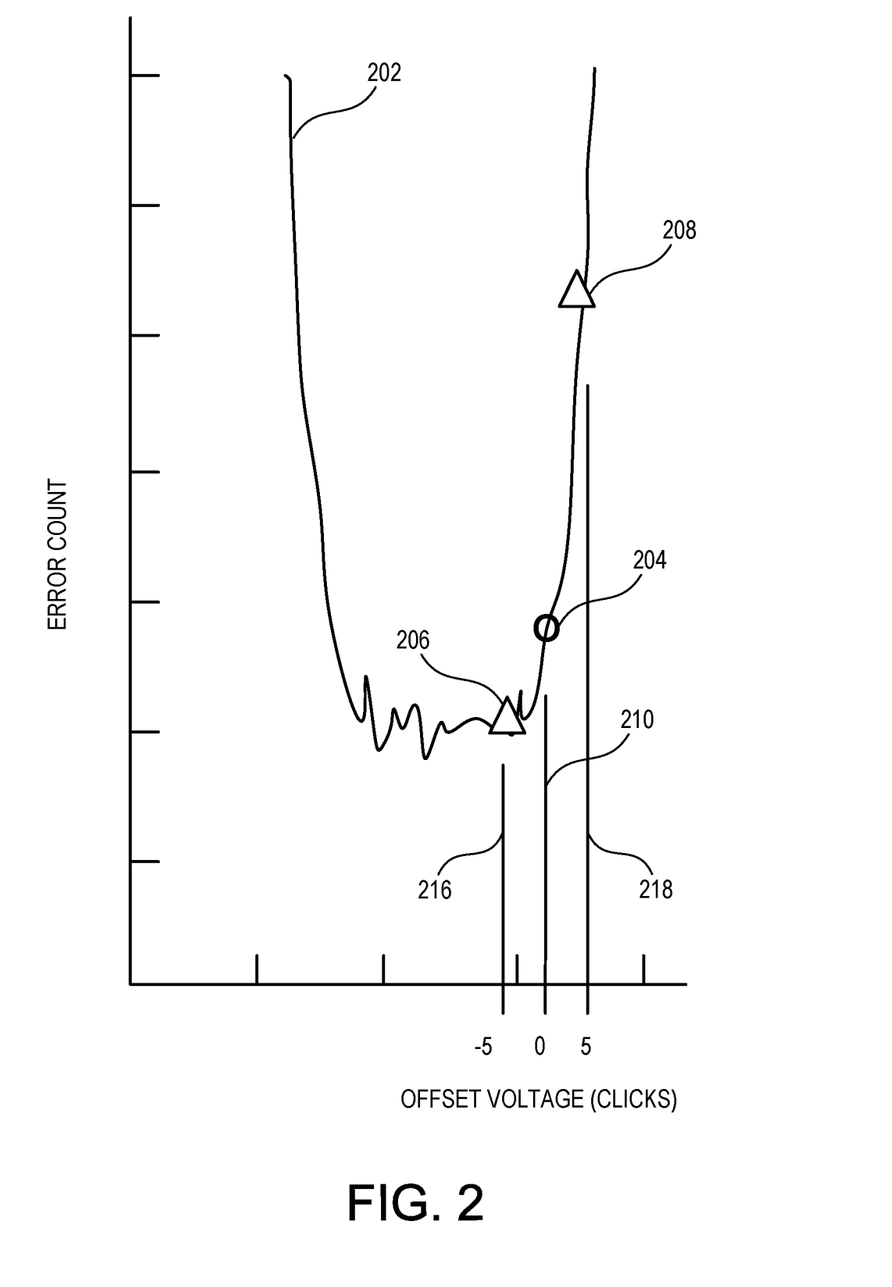
FIG. 2 illustrates an example error distribution graph showing a set of sampled error values, in accordance with some embodiments of the present disclosure.

FIG. 2 shows a graph, error count distribution 202, correlating an error count (shown along the Y-axis) of a memory page with the read level (shown along the X-axis) used in memory operations on a group of memory cells of the memory sub-system 110. The error count distribution 202 can be based on error count data corresponding to multiple read memory operations on a group of memory cells. In some embodiments, information from read operations can be used to generate the error count distribution 202. For example, a memory page in the group of memory cells can be, for example, randomly selected, and in some embodiments, randomly selected form a fully programmed memory block of memory component 112A to 112N. The selected memory page can then be sampled and an error count determined using a read level corresponding to a program distribution level for the memory page. After multiple read memory operations, the error count distribution 202 can be generated. The error count distribution 202 can be based on the component, the page type (e.g., LP, UP, and/or XP for a TLC type memory cells), the word line group (WLG), the level (e.g., L0 to L7 for TLC type memory cells), or any combination thereof. For example, in some embodiments, the error count distribution 202 can be based on each page-type for each WLG.

As seen in FIG. 2, the error count corresponding to the real level 210 is not located at the bottom of the valley of error count distribution 202 or within a threshold distance from the bottom that corresponds to an acceptable error count. The error count distribution 202 and the read level 210 used in the memory operation show an example behavior prior to or in the absence of implementing a calibration of the read level 210. This means that the read level 210 of FIG. 2, which can be used in read memory operations, may be less than optimal and cause performance and/or reliability issued in the memory sub-system 110.

In some embodiments, the processing level calibration component 113 can be implemented to calibrate read level 210 by updating the read level 210 until the error count is reduced to an optimal level, such as, for example, a read level that corresponds to the center of the error count distribution valley 202. In some embodiments, the processing level calibration component 113 can be implemented multiple times over a duration to iteratively update the read level 210 until it is calibrated, if needed. That is, the processing level calibration component 113 can calibrate the read level 210 using an iterative approach that makes incremental updates to the threshold voltage of the read level until the read level 210 is centered at the bottom of the valley of the error distribution 202. In some embodiments, the processing level calibration component 113 can calibrate the read level 210 from an uncalibrated read level to a calibrated read level in one step, i.e., without going through an iterative process.

In initiating or implementing the processing level calibration component 113, the memory system 100 can use one or more of the components therein to sample a set of readings that can include a center result 204, a first offset result 206, a second offset result 208, other results, or a combination thereof. The memory system 100 can update the set of readings based on determining results corresponding to a set of read operations using the read level 210 and/or using a voltage offset from the read level 210. For example, the memory system 100 can determine the center result 204 based on determining the error count corresponding to data read or accessed using a read level 210 for a particular page type of an instance of the memory pages. The center result 204 corresponding to an instance of the read level 210 is represented as "O" in FIG. 2. The memory system 100 can similarly determine the first offset result 206 (represented as a triangle) based on determining the error count corresponding to data read or accessed using a first offset 216. The memory system 100 can also determine the second offset result 208 (represented as a triangle) based on determining the error count corresponding to data read or accessed using a second offset 218 that is different from the first offset 216.

In some embodiments, the first offset result 206 is sampled at a threshold voltage that is offset from the read level 210 by predetermined voltage magnitude in a negative voltage direction, as shown by first offset 216 in FIG. 2. The second offset result 208 is sampled at a threshold voltage that is offset from the read level 210 of the center result 204 by predetermined voltage magnitude in a positive voltage direction, as shown by second offset 218 in FIG. 2. Each of the first offset 216 and the second offset 218 can have a predetermined magnitude that ranges from 1 tick to 10 ticks. For example, as seen in FIG. 2, the first offset 216 has a value of 5 ticks and the second offset 218 has a value of −5 ticks. A tick can be a minimum threshold voltage adjustment of the memory sub-system 110 (e.g., due to the granularity of an analog-to-digital converter (ADC)) and can be in a range of 10 mV to 20 mV. In some embodiments, the first offset 216 is equal in magnitude to the second offset 218, i.e., the offsets are symmetrical. In other embodiments, the first and second offset magnitudes can be different, i.e., the offsets are asymmetrical.

Once a set of readings are sampled, the center result 204, the first offset result 206 and the second offset result 208 can be used to calibrate the read level 210 such that the error count during read operations is minimized. For example, the read level 210 can be calibrated such that the read level is centered at the bottom of the valley of the error distribution 202. As discussed in further detail below, in some embodiments, the read level calibration component 113 can implement a calibration method that uses vectors corresponding to the sampled results (also referred to herein as "vectorized calibration process") to iteratively update the read level 210 until the read level 210 is calibrated. In some embodiments, an iterative approach is not used and the updated read level 210 becomes the calibrated read level in one step. Whether using an iterative process or a one-step process, the processing level calibration component 113 can utilize a vectorized calibration process to find a read level that optimizes (e.g., minimizes) the error count when performing read memory operations.

Figure 3:
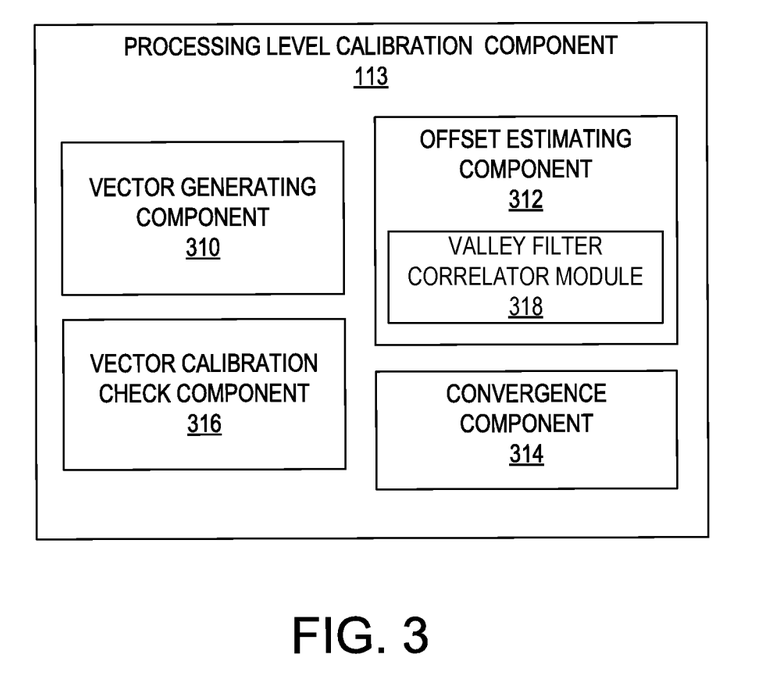
FIG. 3 illustrates an example processing level calibration component, in accordance with some embodiments of the present disclosure.

As discussed above, the processing level calibration component 113 samples a set of read level samples from the error count distribution 202 based on the current read level voltage 210, including, for example, a center result 204, a first offset result 206 based on a first offset 216, and a second offset result 208 based on a second offset 218. The current read level voltage 210 can be an uncalibrated read level or a calibrated read level. The set of sampled results can be used to generate vectors that, when analyzed by the processing level calibration component 113, provide a status of whether the read level 210 needs calibration. As seen in FIG. 3, in some embodiments, the processing level calibration component 113 can include a vector generating component 310 that receives the set of sampled results (e.g., center result 204, first offset result 206, and a second offset result 208), and based on the sampled results, the vector generating component 310 can determine a first vector A and a second vector B for the sampled results with center result 204 as the common point of origin of the vectors A and B (FIG. 4).

Figure 4:
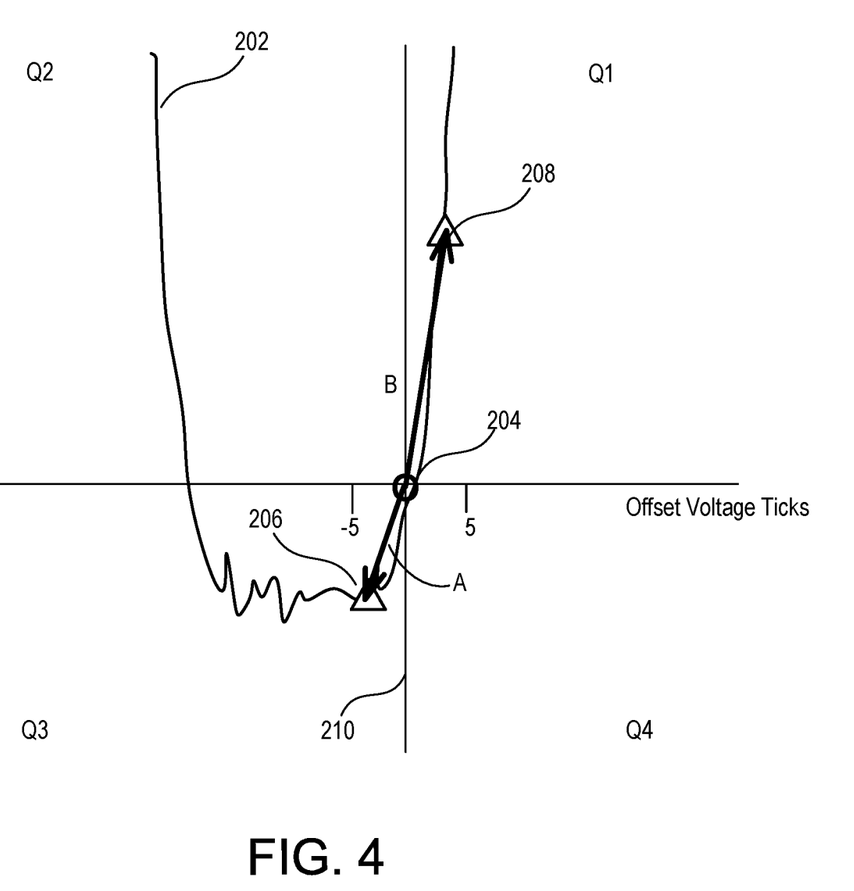
FIG. 4 illustrates an example error distribution graph showing a set of sampled error values and corresponding generated vectors, in accordance with some embodiments of the present disclosure.

In some embodiments, the processing level calibration component 113 can use one or more coordinate systems in processing vectors A and B, such as for example, an x-y coordinate system as seen in FIG. 4. In FIG. 4, the y-axis corresponds to the current read voltage 210 and the x-axis corresponds to the offset voltage (in ticks). The x-axis corresponds to a line that is perpendicular to the y-axis and intersects the center result 204. Of course, another type of coordinate systems such as, for example, a polar coordinate system, or any combination of coordinate systems can be used by the processing level calibration component 113 when processing the vectors A and B.

In some embodiments, the first component of each vector A and B (referred to herein as "Ay" and "By," respectively) is based on the valley characteristic (e.g., width, depth, slope, symmetry, etc.) of the error distribution 202, and a second component of each vector A and B (referred to herein as "Ax" and "Bx," respectively) is based on the sample offset. For example, the vector generating component 310 can calculate the Ax component of the first vector A based on a difference between the value of center result 204 and the value of first offset result 206, and calculate the Ay component of vector A based on the value of first offset 216. Similarly, the vector generating component 310 can calculate the Bx component of the vector B based on a difference between the value of center result 204 and the value of second offset result 208, and calculate the By component of the vector B based on the value of second offset 218. In the example embodiment, the magnitudes of the Ax and Bx components correspond to ticks rather than error counts like the Ay and By components. However, because the calibration of the read level 210 can be based on relative adjustments rather than requiring absolute values for the magnitudes for vectors A and B, the tick values for Ax and Bx can be treated as corresponding to error counts for calibration purposes. For example, 5 ticks can correspond to error count of 5. Accordingly, the magnitude of the vector A can be determined by the equation $A_{mag}=(Ax^2+Ay^2)^{1/2}$. The magnitude of the vector B is similarly determined by the equation $B_{mag}=(Bx^2+By^2)^{1/2}$.

As seen in FIG. 4, the output of the vector generating component 310 produces vectors A and B having magnitudes corresponding to the respective error counts. For explanation purposes, the error distribution 202 is overlaid on the coordinate system of FIG. 4 to show the relationship between the vectors A and B and the error distribution 202. Comparing FIG. 4 and FIG. 2, the vertical axis of FIG. 4 corresponds to read voltage 210 of FIG. 2 and the horizontal axis corresponds to an offset voltage (in ticks) from the read voltage 210. Accordingly, in the present example, the vectors A and B provide a visual representation that read level 210 of FIG. 4 is in an uncalibrated state. In some embodiments, the memory sub-system 110 can automatically analyze the vectors A and B generated by the vector generating component 310 and determine whether the current read level 210 is in a calibrated state.

For example, in some embodiments, the processing level calibration component 113 includes a vector calibration check component 316 that determines whether the current read level 210 is at an optimized (calibrated) read level for the read memory operations. In some embodiments, upon initiation of the processing level calibration component 113, the vector generating component 310 receives or accesses the set of sample results, including center result 204, first offset result 206, and second offset result 208, for the current read level 210. The vector generating component 310 then generates vectors A and B, as discussed above. The information for vectors A and B is received by vector calibration check component 316, which then determines whether the vectors A and B represent a calibrated state, as discussed below.

Figure 5:
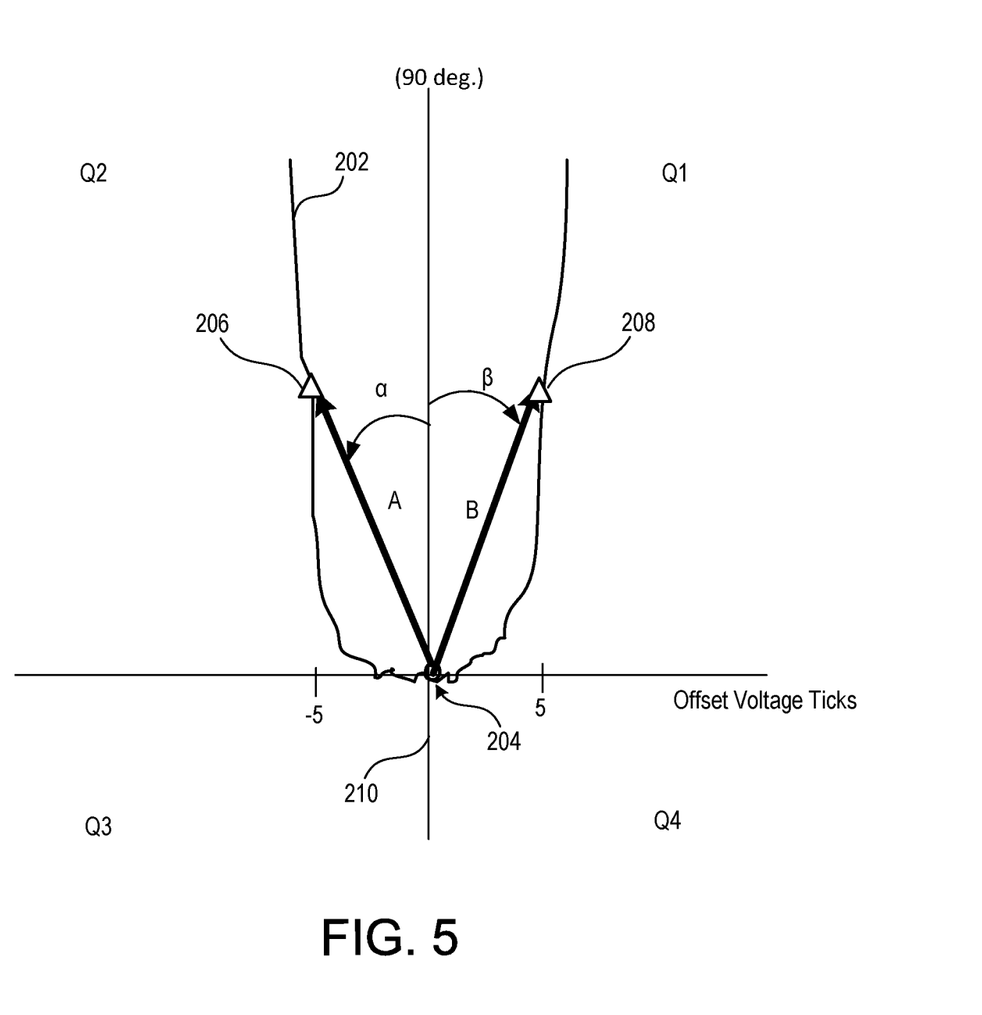
FIG. 5 illustrates an example error distribution graph showing a set of sampled error values and corresponding generated vectors, in accordance with some embodiments of the present disclosure.

In some embodiments, the vector calibration check component 316 can determine whether the current read level 210 is optimized (and thus in a calibrated state) based on a comparison of the vectors A and B. For example, the vector calibration check component 316 can determine that the current read level 210 is at an optimal threshold level (e.g., at a valley center) if the vectors A and B satisfy a predetermined relationship to each other. In some embodiments, the predetermined relationship can be that the magnitudes of vectors A and B are equal within a predetermined limit. In some embodiments, for the vector calibration check component 316 to determine whether the current read level 210 is optimized (and thus in a calibrated state), the phase angles of vectors A and B must satisfy a predetermined relationship. For example, the predetermined relationship can be that the phase angles of the vectors A and B with respect to a central axis must be equal and opposite to within a predetermined limit. In some embodiments, as seen in FIG. 5, when the vectors A and B are in the quadrants Q2 and Q1, respectively, a phase angle α of the vector A with respect to the y-axis separating the quadrants Q1 and Q2 (designated "90 deg." in FIG. 5) must be equal and opposite to the phase angle β of vector B with respect to the y-axis at 90 deg. to within a predetermined limit. For the example in FIG. 5, angle α=arctan (Ax/Ay) and angle β=arctan (Bx/By). Because Ax component is negative, the angle α will be negative with respect to the y-axis at 90 deg. In some embodiments, the processing level calibration component 113 can determine an optimized or calibrated read level is reached when the magnitudes of vectors A and B are equal to within a predetermined limit, the phase angles of vectors A and B with respect to a vertical axis corresponding to the read level (e.g., the y-axis at 90 deg. in FIG. 5) are equal and opposite to within a predetermined limit, and/or a dither condition is reached (a threshold voltage corresponding to the read level is oscillating between two values) with respect to updating the read level 210.

An example representation of a memory sub-system 110 in which read level 210 is in a calibrated state is shown in FIG. 5. FIG. 5 illustrates an error distribution 202 with a set of readings that were sampled, for example, after the processing level calibration component 113 has completed an update cycle for read level 210. The sampled set of readings includes a center result 204, a first offset result 206 sampled at a first offset 216, and a second offset result 208 taken at a second offset 218. Vectors A and B can be generated from the set of readings, as discussed above. Once the vectors A and B have been generated, the vector calibration check component 316 can determine whether an optimal calibration state with respect the updated read level has been reached (e.g., the updated read level is at the center of the valley of the error distribution 202). In the example of FIG. 5, α is equal to –β to within a predetermined limit and/or the magnitudes of vectors A and B are equal to within a predetermined limit. Accordingly, the vector calibration check component 316 will determine that the read level 210 is in a calibrated state. As seen in FIG. 5, by meeting one or both conditions (magnitudes and phases of vectors A and B), the read level 210 is at approximately at the center of the error distribution valley. Although not shown in FIG. 5, the vector calibration check component 316 can also determine that the read level 210 has reached a calibrated state if a dither condition has been reached.

If the vectors A and B are determined to be in a calibrated state, the processing level calibration component 113 stops further updates (adjustments) to the read level 210. If the vector calibration check component 316 determines that the read level 210 is not at an optimum read level 210, the vector calibration check component 316 determines that the read level 210 requires calibration.

If vectors A and B are determined not to be in a calibrated state, in some embodiments, the processing level calibration component 113 includes an offset estimating component 312 to calibrate the read level 210 (e.g., from the uncalibrated state shown in FIG. 4 to the calibrated state shown in FIG. 5). For example, in some embodiments, the offset estimating component 312 estimates a read level trim or offset (hereinafter "estimated offset") to be applied to the read level 210 to generate an updated read level 210. The estimated offset can provide a magnitude and direction for shifting the read level 210 from its current voltage value to the updated read level value that minimizes the error count for the read operations on the set of memory cells corresponding to error distribution 202. To calculate the estimated offset, the offset estimating component 312 can receive and use information, including component information, related to vectors A and B. For example, the offset estimating component 312 can compare the magnitudes of vectors A and B, and/or the phase angles of the vectors A and B (and/or components thereof) and estimate the offset (magnitude and direction) that the read level 210 should be shifted.

In some embodiments, the offset estimating component 312 can first determine the quadrant (e.g., Q1-Q4) on an x-y coordinate system that the vectors A and B are located in. For example, if the first offset result 206 is greater than or equal to the center result 204, then vector A is determined to be in quadrant Q2. If the first offset result 206 is less than the center result 204, then vector A is determined to be in quadrant Q3. If the second offset result 208 is greater than or equal to the center result 204, then vector B is determined to be in quadrant Q1. If the second offset result 206 is less than the center result 204, then vector B is determined to be in quadrant Q4.

If the offset estimating component 312 determines that vector A is in quadrant Q3 or that the vector B is in quadrant Q4, it can mean that the center result 204 is on a sidewall of the error distribution 202 and not near the bottom and thus read level 210 is uncalibrated. For example, as seen in FIG. 4 which represents an uncalibrated read level, vector A is in quadrant Q3 and the center result 204 is on the right side wall of the error distribution 202. Conversely, if vector B was in quadrant Q4 (instead of quadrant Q1), the center result 204 can be on the left side wall of the error distribution 202, which means that the read level is uncalibrated.

In some embodiments, if vector A is in quadrant Q3 or if vector B is in quadrant Q4, the offset estimating component 312 estimates an appropriate offset (e.g., magnitude and/or direction) that the read level 210 should shift for the vectors A and B to be in quadrants Q2 and Q1, respectively. For example, if vector B is in quadrant Q4, the read level 210 can be shifted to the positive threshold voltage direction by a predetermined amount until the vector B is in quadrant Q1. Alternatively, or in addition to the predetermined amount, the read level 210 can be shifted to the positive threshold voltage direction by a calculated number of ticks corresponding to a magnitude and/or direction of vectors A and/or B (and/or components thereof) until the vector B is in quadrant Q1. If vector A is in quadrant Q3, the read level 210 can be shifted to the negative threshold voltage direction by a predetermined amount until the vector A is in quadrant Q2. Alternatively, or in addition to the predetermined amount, the read level 210 can be shifted to the negative threshold voltage direction by a calculated number of ticks corresponding to a magnitude and/or direction of vectors A and/or B (and/or components thereof) until the vector A is in quadrant Q2.

If vector A is in quadrant Q2 and vector B is in quadrant Q1 (either originally or by shifting via offset estimating component 312), the offset estimating component 312 can then complete the read level calibration process. For example, in some embodiments, a difference between the magnitudes of components Ay and By can be calculated to estimate the read level offset or trim. The calculated difference in the magnitudes of components Ay and By can be scaled appropriately to shift the read level 210 by a number of ticks corresponding to the calculated difference. In the present example, the direction of the shift can be based on which of the components Ay and By is larger. If Ay is larger, the read level 210 can be shifted to the positive threshold voltage direction by the number of ticks corresponding to the calculated difference. If By is larger, the read level 210 can be shifted in the negative threshold voltage direction by the number of ticks corresponding to the calculated difference. If the vector calibration check component 316 determines an optimized read level is reached as discussed above, then no adjustment is made.

Because the minimum read level shift is 1 tick, the estimated offset can be output from the offset estimating component 312 in integer format as, for example, whole number ticks. For example, in some embodiments, if the output of the offset estimating component 312 is 2.54 ticks, the sub-tick portion, 0.54 tick, can be truncated and the read level 210 can be shifted by 2 ticks. In some embodiments, the sub-tick portion is rounded up or down. For example, a sub-tick of 0.5 or greater is rounded up and a sub-tick portion less than 0.5 is rounded down. In the example above, 2.54 ticks will result in an estimated offset of 3 ticks. In some embodiments, the sub-tick portion is stored in order to be used in the next read level update cycle. For example, instead of discarding or rounding the 0.54 tick portion in the above example of 2.54 ticks, the read level 210 is shifted by 2 ticks and the 0.54 tick is stored in memory (e.g., memory 119, in one or more media component 112A to 112N, in some other memory in memory sub-system 110, in host 120, or in any combination thereof), and the estimated offset of the next read level cycle is modified by adding the 0.54 tick stored in memory. The read level 210 is then shifted by the whole number portion of the modified estimated offset.

In some embodiments, the offset estimating component 312 can include a valley filter correlator module 318 to calculate and/or modify the estimated offset based on a characteristic of the valley of the error distribution 202. The characteristic of the valley can be different based on which program distribution level is being read and/or based on the memory type (e.g., MLC, TLC, QLC, etc.). For example, a valley between a level 0 program distribution and a level 1 program distribution can be wider than the valleys between the other program distribution levels. In addition, the valleys in a MLC type memory can be wider than valleys in a QLC type memory. By calculating and/or modifying the estimated offset based on the valley characteristic, a more accurate read level offset or trim can be achieved. For example, valley characteristic information from the valley filter correlator module 318 of the offset estimating component 312 can be used to determine where the center result 204 and the first and second offset results 206, 208 are located on the error distribution 202 (e.g., left or right sidewall, bottom, etc.). Based on the location on the error distribution 202, the offset estimating component 312 can calculate the magnitude and direction of the estimated offset. The valley filter correlator module 318 can be used with samples having symmetrical offsets 206, 206 and/or asymmetrical offsets 206, 208 when calculating the magnitude and direction of the estimated offset.

In some embodiments, an exact location on the error distribution 202 is not calculated. Instead, the offset estimating component 312 modifies an intermediate offset value (e.g., determined based on a difference in the magnitudes and/or phase angles of vectors A and B) with the valley characteristic information received from the valley filter correlator module 318 to calculate the estimated offset. For example, if the read level calibration is directed to a wide valley, such as for example, valley 1 between program level 0 and program level 1, based on the valley information from the valley filter correlator module 318 can, the offset estimating component 312 can calculate the estimated offset by appropriately increasing the intermediate offset value to take into account the wider valley. Similarly, if calibrating read levels for QLC type memory, the offset estimating component 312 can, for example, calculate the estimated offset by appropriately decreasing the intermediate offset value to take into account the narrower valleys of a QLC type memory.

In some embodiments, the processing level calibration component 113 can include a convergence component 314 that receives the estimated offset from the offset estimating component 312 and applies an appropriate gain prior to adjusting the read level value 210. The output convergence component 314 can be used by the processing level calibration component 113 to shift the read level value 210 to an updated read level. If the calibration criteria checks are met, the updated read level becomes the new calibrated read level 210. In some embodiments, the gain of the convergence component 314 can be adjustable to promote fast and/or stable convergence of the read level update cycles to the final calibrated read level value. For example, the gain of the convergence component 314 can be controlled based on the type of memory sub-system 110, the type of memory cell (e.g., MLC, TLC, QLC, etc.), the WLG, the page type (e.g., an LP page, a UP page, an XP page, a TP page depending on the type of memory), or any combination thereof to minimize the number of iterations needed to calibrate the read level and/or to ensure that the operations of the memory sub-systems 110 remain stable during the iterations. For example, in case where only small changes in the ticks can be tolerated (e.g., in QLC memory with narrow valleys), the gain function of the convergence component 314 can be small. In cases where a fast convergence is needed, such as, for example, quickly calibrating the memory sub-system after a long retention, a large gain can be used. In addition, in some embodiments, the gain can be adjusted based on the magnitudes of vectors A and B and/or an error count difference of, for example, the center result 204 between read level updates. For example, the gain can be lowered if the error count difference between the vectors A and B is small and/or if the difference between the error counts of, for example, the center result 204 is small between read level updates. Similarly, the gain can be increased if the error count difference between the vectors A and B is large and/or if the difference between the error counts of, for example, the center result 204 is large between read level updates.

Once the read level 210 has been updated, the memory sub-system 110 can repeat the process. For example, the memory sub-system 110 can use the updated instance of the read level 210 to calculate a new set of readings (e.g., center result 204, first offset result 206, and/or second offset result 208) for subsequent iterations or implementations of the processing level calibration component 113 to calculate another updated read level 210. The process can repeat until the read level 210 is determined to be optimized with respect to the error count as discussed above.

Although the example embodiments were described with respect to calibrating read levels, the embodiments of the present disclosure are also applicable to calibrating other threshold voltages such as, for example, PV levels used in PV operations.

Figure 6:
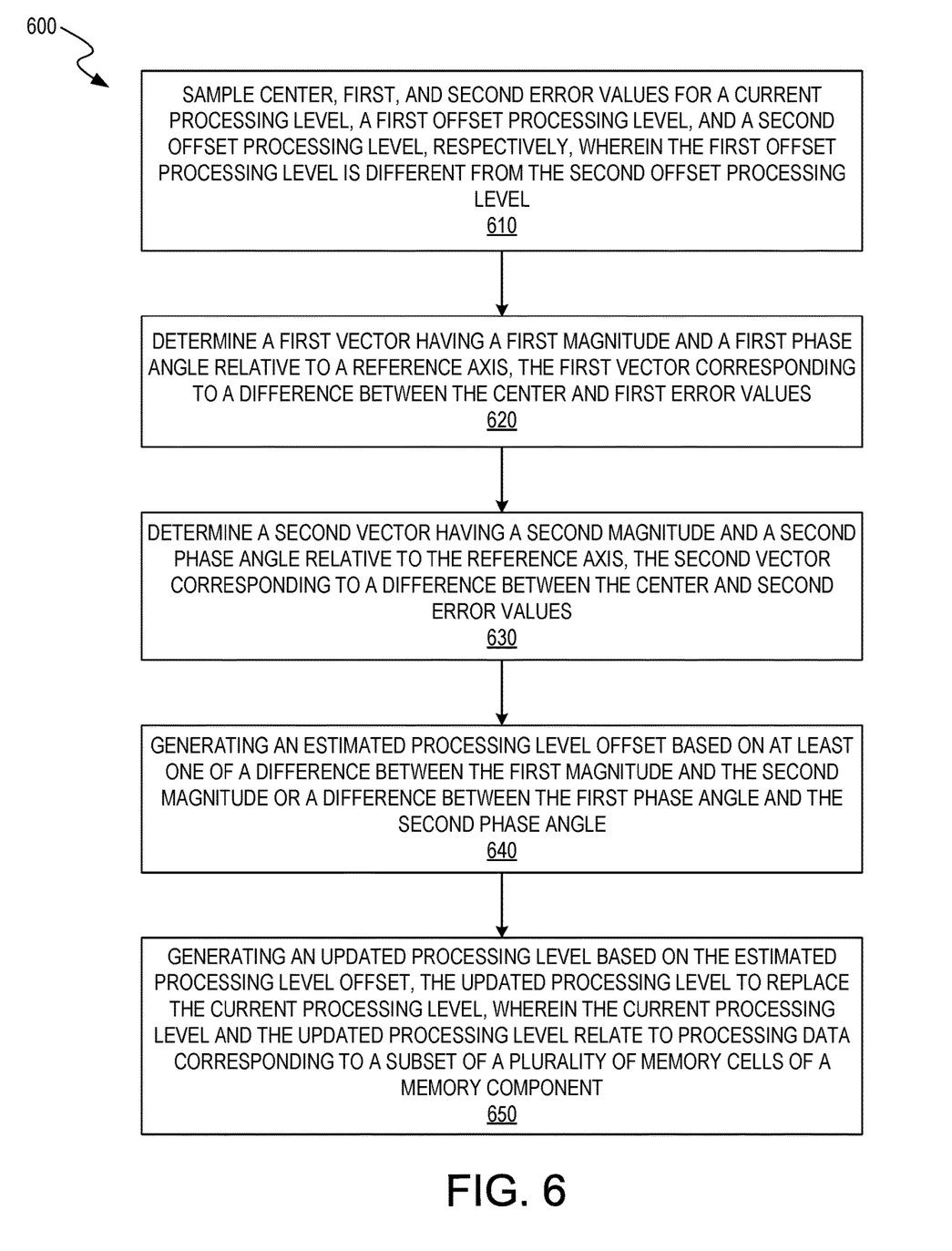
FIG. 6 is a flow diagram of an example method to provide vectorized processing level calibration, in accordance with some embodiments of the present disclosure.

FIG. 6 is a flow diagram illustrating example method 600 for managing vectorized processing level calibration of memory operations. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the processing level calibration component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 610, the processing device (e.g., processor 117) samples center, first, and second error values for a current processing level, a first offset processing level, and a second offset processing level, respectively, wherein the first offset processing level is different from the second offset processing level. An offset process level is a voltage that is used for performing a memory operation such as, for example a read memory operation, but the offset voltage is shifted from the threshold voltage of the current processing level for performing the memory operation. In some embodiments, the current processing level can be read level 210, the first offset processing level can be first offset 216, the second offset processing level can be second offset 218, as discussed above. The center error value can be center result 204 based on the read level 210, the first error value can be first offset result 206, and the second error value can be the second offset result 208, as discussed above.

At block 620, the processing device (e.g., processor 117) determines a first vector having a first magnitude and a first phase angle relative to a reference axis, and the first vector can correspond to a difference between the center and first error values. For example, the first vector can be vector A as discussed above. At block 630, the processing device (e.g., processor 117) determines a second vector having a second magnitude and a second phase angle relative to the reference axis, and the second vector can correspond to a difference between the center and second error values. For example, the second vector can be vector B, as discussed above.

At block 640, the processing device (e.g., processor 117) generates an estimated processing level offset based on a comparison between at least one component of the first magnitude and at least one component of the second magnitude. For example, a comparison of the Ay and By components of the vectors A and B can be made to determine an estimated offset, as discussed above. At block 650, the processing device (e.g., processor 117) generates an updated processing level based on the estimated processing level offset, and the updated processing level replaces the current processing level. The current processing level and the updated processing level relate to processing data corresponding to a subset of a plurality of memory cells of a memory component, e.g., memory cells of one or more memory components 112A to 112N. In some embodiments, the steps of method 600 are repeated until the processing level (e.g., read level 210) has been calibrated, as discussed above.

Figure 7:
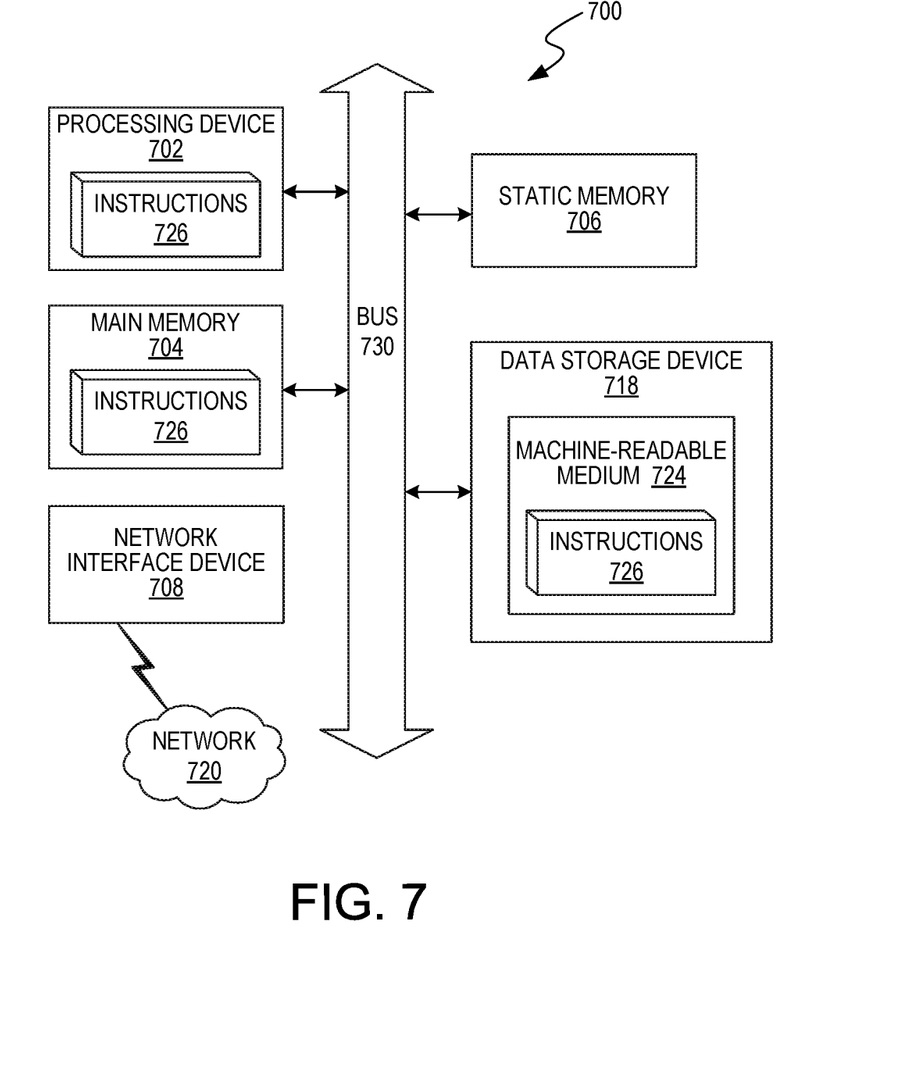
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the process level calibration component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

Processing device 702 represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage device 718 can include a machine-readable storage medium 724 (also known as a computer-readable medium) on which is stored one or more sets of instructions or software 726 embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage device 718, and/or main memory 704 can correspond to the memory sub-system 110 of FIG. 1.

In one implementation, the instructions 726 include instructions to implement functionality corresponding to processing level calibration (e.g., process level calibration component 113 of FIG. 1). While the machine-readable storage medium 724 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

We claim:

1. A system, comprising:
a memory component including a plurality of memory cells; and
a processing device, operatively coupled to the memory device, to:
determine a first vector having a first magnitude and a first phase angle relative to a reference axis, the first vector corresponding to a difference between an error value for a current processing level for processing data and an error value for a first offset processing level,
determine a second vector having a second magnitude and a second phase angle relative to the reference axis, the second vector corresponding to a difference between the error value for the current processing level and an error value for a second offset processing level, wherein the first offset processing level is different from the second offset processing level,
generate an estimated processing level offset based on at least one of a difference between the first magnitude and the second magnitude or a difference between the first phase angle and the second phase angle, and
generate an updated processing level based on the estimated processing level offset, the updated processing level to replace the current processing level,
wherein the current processing level and the updated processing level relate to processing the data for a subset of the plurality of memory cells.

2. The system of claim 1, wherein the generation of the estimated processing level offset includes estimating a shift in a process level value of the current processing level based on a difference between at least one component of the first magnitude or at least one component of the second magnitude.

3. The system of claim 2, wherein the shift in the process level value is further based on a characteristic of a valley distribution associated with the current processing level.

4. The system of claim 2, wherein the determination of the first vector, the determination of the second vector, the generation of the estimated processing level offset, the generation of the updated processing level, and replacement of the current processing level with the updated processing level is processed iteratively until at least one of,
- the difference between the first magnitude and the second magnitude is within a first predetermined value,
- the difference between the first phase and a negative of the second phase with respect to the reference axis is within a second predetermined value, wherein the reference axis corresponds to the updated processing level, or
- a dither condition is reached for the updated processing level.

5. The system of claim 4, wherein the updated processing level is an output of a convergence function with the estimated processing level offset as an input to the convergence function, the convergence function determining a rate of convergence for the iterative processing, and
  wherein a gain for the convergence function is dependent on a type of memory cell in the subset of the plurality of memory cells.

6. The system of claim 1, wherein the plurality of memory cells is arranged in a plurality of memory pages, and wherein the subset comprises one of the plurality of memory pages.

7. The system of claim 1, wherein the current processing level, the first offset processing level, the second offset processing level, and the updated processing level are threshold voltages corresponding to read levels.

8. A method, comprising:
  sampling center, first, and second error values for a current processing level, a first offset processing level, and a second offset processing level, respectively, wherein the first offset processing level is different from the second offset processing level;
  determining a first vector having a first magnitude and a first phase angle relative to a reference axis, the first vector corresponding to a difference between the center and first error values;
  determining a second vector having a second magnitude and a second phase angle relative to the reference axis, the second vector corresponding to a difference between the center and second error values;
  generating an estimated processing level offset based on at least one of a difference between the first magnitude and the second magnitude or a difference between the first phase angle and the second phase angle; and
  generating an updated processing level based on the estimated processing level offset, the updated processing level to replace the current processing level,
  wherein the current processing level and the updated processing level relate to processing data corresponding to a subset of a plurality of memory cells of a memory component.

9. The method of claim 8, wherein the generating of the estimated processing level offset includes estimating a shift in a process level value of the current processing level based on a difference between at least one component of the first magnitude or at least one component of the second magnitude.

10. The method of claim 9, wherein the shift in the process level value is further based on a characteristic of a valley distribution associated with the current processing level.

11. The method of claim 9, further comprising:
  processing iteratively the determining of the first vector, the determining of the second vector, the generating of the estimated processing level offset, the generating of the updated processing level, and replacing of the current processing level with the updated processing level until at least one of,
  the difference between the first magnitude and the second magnitude is within a first predetermined value,
  the difference between the first phase and a negative of the second phase with respect to the reference axis is within a second predetermined value, wherein the reference axis corresponds to the updated processing level, or
  a dither condition is reached for the updated processing level.

12. The method of claim 11, further comprising:
  determining a rate of convergence for the iterative generation based on a type of memory cell in the subset of the plurality of memory cells.

13. The method of claim 9, wherein the plurality of memory cells is arranged in a plurality of memory pages, and
  wherein the subset comprises one of the plurality of memory pages.

14. The method of claim 8, wherein the current processing level, the first offset processing level, the second offset processing level, and the updated processing level are threshold voltages corresponding to read levels.

15. A non-transitory computer-readable storage medium comprising instructions that, when executed by a processing device, cause the processing device to:
  determine a first vector having a first magnitude and a first phase angle relative to a reference axis, the first vector corresponding to a difference between an error value for a current processing level for processing data and an error value for a first offset processing level;
  determine a second vector having a second magnitude and a second phase angle relative to a reference axis, the second vector corresponding to a difference between the error value for the current processing level and an error value for a second offset processing level for processing the data, wherein the first offset processing level is different from the second offset processing level;
  generate an estimated processing level offset based on at least one of a difference between the first magnitude and the second magnitude or a difference between the first phase angle and the second phase angle; and
  generate an updated processing level based on the estimated processing level offset, the updated processing level to replace the current processing level,
  wherein the current processing level and the updated processing level relate to processing the data corresponding to a subset of a plurality of memory cells of a memory component.

16. The non-transitory computer-readable storage medium of claim 15, wherein the generating of the estimated processing level offset includes estimating a shift in a process level value of the current processing level based on a difference between at least one component of the first magnitude or at least one component of the second magnitude.

17. The non-transitory computer-readable storage medium of claim 15, wherein the shift in the process level value is further based on a characteristic of a valley distribution associated with the current processing level.

18. The non-transitory computer-readable storage medium of claim 15, further causing the processing device to:

processing iteratively the determining of the first vector, the determining of the second vector, the generating of the estimated processing level offset, the generating of the updated processing level, and replacing of the current processing level with the updated processing level until at least one of, the difference between the first magnitude and the second magnitude is within a first predetermined value, the difference between the first phase and a negative of the second phase with respect to the reference axis is within a second predetermined value, wherein the reference axis corresponds to the updated processing level, or a dither condition is reached for the updated processing level.

19. The non-transitory computer-readable storage medium of claim 18, further causing the processing device to:
  determine a rate of convergence for the iterative generation based on a type of memory cell in the subset of the plurality of memory cells.

20. The non-transitory computer-readable storage medium of claim 15, wherein the current processing level, the first offset processing level, the second offset processing level, and the updated processing level are all read level voltages.

* * * * *